United States Patent [19]
Shimizu et al.

[11] Patent Number: 5,119,337
[45] Date of Patent: Jun. 2, 1992

[54] SEMICONDUCTOR MEMORY DEVICE HAVING BURN-IN TEST FUNCTION

[75] Inventors: Mitsuru Shimizu, Sakura; Syuso Fujii, Kawasaki; Shozo Saito, Yokohama, all of Japan

[73] Assignee: Kabushiki Kaisha Toshiba, Kawasaki, Japan

[21] Appl. No.: 509,212

[22] Filed: Apr. 16, 1990

[30] Foreign Application Priority Data

May 20, 1989 [JP] Japan ................... 1-127524

[51] Int. Cl.$^5$ ............................................. G11C 29/00
[52] U.S. Cl. ........................... 365/201; 365/189.09; 371/21.4
[58] Field of Search ............ 365/201, 189.09; 371/21.1, 21.4, 28; 324/158 T; 307/296.2

[56] References Cited

U.S. PATENT DOCUMENTS

| | | | |
|---|---|---|---|
| 4,527,254 | 7/1985 | Ryan et al. ............ | 365/201 X |
| 4,651,304 | 3/1987 | Takata ................... | 365/201 |
| 4,730,279 | 3/1988 | Ohtani ................... | 365/203 |
| 4,751,679 | 6/1988 | Dehganpour ........... | 365/201 |
| 4,779,272 | 10/1988 | Kohda et al. ........... | 371/21 |
| 4,788,664 | 11/1988 | Tobita ................... | 365/230.01 |
| 4,811,299 | 3/1989 | Miyazawa et al. ..... | 365/201 |
| 4,819,212 | 4/1989 | Nakai et al. ........... | 365/201 |
| 4,860,259 | 8/1989 | Tobita ................... | 365/201 |
| 4,879,689 | 11/1989 | Atsumi et al. ......... | 365/201 |

FOREIGN PATENT DOCUMENTS 0030244 6/1981 European Pat. Off. .
0037285 10/1981 European Pat. Off. .
63-34796 2/1988 Japan .

*Primary Examiner*—Joseph A. Popek
*Attorney, Agent, or Firm*—Banner, Birch, McKie & Beckett

[57] ABSTRACT

A semiconductor memory device such as dynamic random access memories comprises a work line drive circuit provided with two MOS transistors and a word line to which a word line drive signal is supplied, a substrate bias generation circuit for applying a bias voltage to a semiconductor substrate for MOS transistors, a burn-in mode detection circuit for detecting a burn-in test mode signal, and a substrate bias control circuit for controlling the substrate bias generation circuit. When the semiconductor memory device is subjected to a burn-in test, the power supply level Vcc is increased to raise the voltage of the word line drive signal as compared to that at a normal operation. Accordingly, a high level word line drive signal will be applied to cell transistors, thereby performing correct screening thereof.

9 Claims, 2 Drawing Sheets

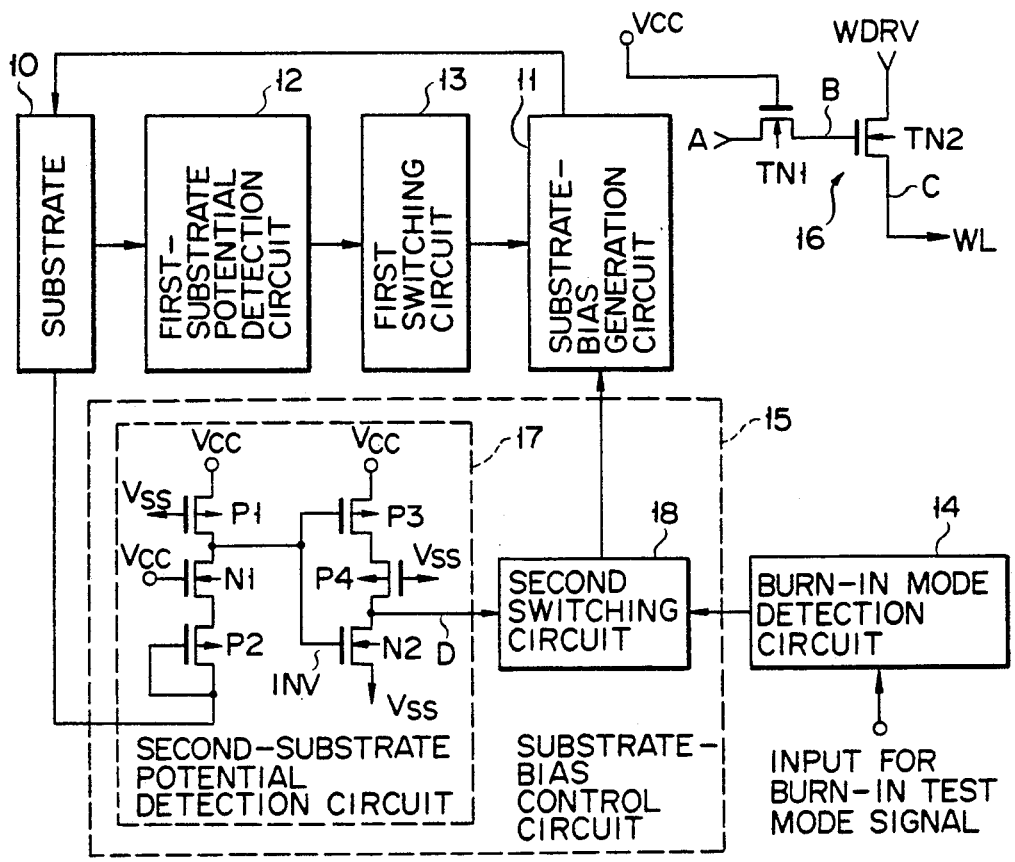
F I G. 1
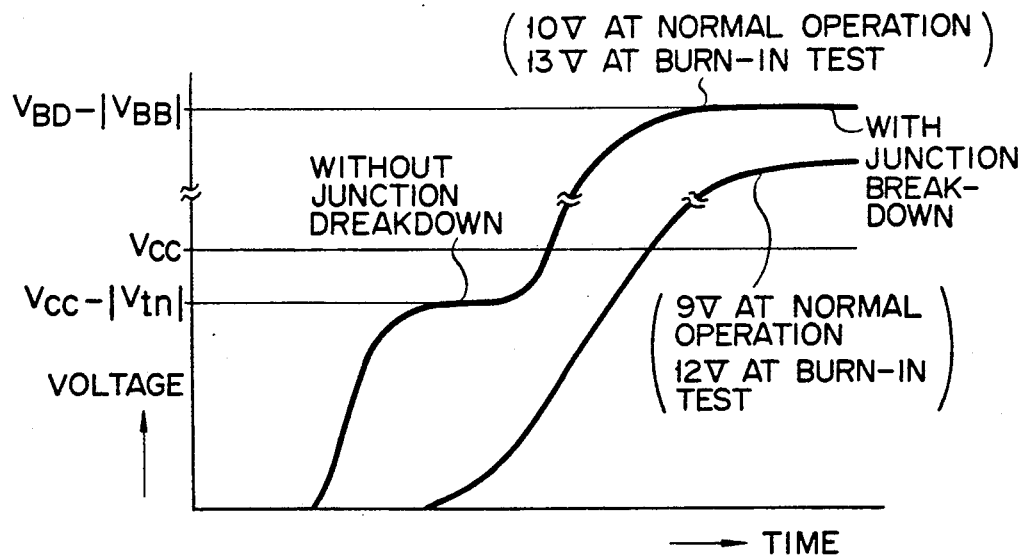
F I G. 2

SEMICONDUCTOR MEMORY DEVICE HAVING BURN-IN TEST FUNCTION

BACKGROUND OF THE INVENTION

1. Field of the Invention

This invention relates to a semiconductor memory device, and more particularly to a circuit for increasing a word line potential at the time of a burn-in test (i.e., an operation test for screening cell transistors) to a value higher than at a normal operation time.

2. Description of the Related Art

A conventional word line drive circuit for semiconductor memory devices such as dynamic random access memories (DRAMs) has been provided as shown in FIG. 3. In FIG. 3, TN1 and TN2 respectively denote first and second N-channel transistors of insulated gate type (MOS type). A row decode output signal A from a row decoder (not shown) is entered in one end of the first transistor TN1, a power supply potential Vcc (for example, 5 V) is applied to the gate thereof, and the other end thereof is connected to the gate of the second transistor TN2. A word line drive control signal WDRV is applied to one end of the second transistor TN2, and a bootstrapped word line drive signal C fed from the other end thereof is supplied to a word line WL. The word line is connected to the respective gates of a large number of cell transistors (not shown).

The operation performed in a case where the row decode output signal A is at an enabled level (in this example, the power supply level Vcc of 5V) will be explained with reference to FIG. 4. In this case, the first transistor TN1 is turned on, and a potential of a node B on the other end thereof (on the gate side of the second transistor TN2) becomes "Vcc−|Vtn|" (Vtn is the gate threshold voltage of the first transistor TN1). The potential of the node B rises until junction breakdown is caused by the coupling of the first transistor TN1. The potential of the node B at this time becomes "$V_{BD} - |V_{BB}|$" and the potential of the word line drive signal C rises as the potential of the node B is increased.

At this time, VBD is the junction breakdown voltage in N-type high impurity concentration regions acting as source and drain regions of the N-channel transistor, and $V_{BB}$ is a voltage for a semiconductor substrate (P-type substrate or P-type well) in which the N-channel transistors are provided. A substrate bias voltage is applied to the substrate from a substrate bias generation circuit.

For example, if the word line drive control signal WDRV is 7.5V, the junction breakdown voltage $V_{BD}$ is 12 V, the substrate voltage $V_{BB}$ is −3V and the gate threshold voltage Vtn is 1.5V, then the potential of the node B becomes approx. 9V and the word line drive signal C becomes approx. 7.5V when the power supply level Vcc is 5V.

When the power supply level Vcc is raised from 5V to 7V, for example, at the time of a burn-in test for a DRAM having the above word line drive circuit, the potential of the node B is kept at approximately 9V, which is substantially the same as the potential set at the time of a normal operation, and the word line drive signal C is at approximately 7.5V, which is substantially the same as the potential set at the time of the normal operation, and as a result, it is not possible to apply a high level word line drive signal to the cell transistors, thereby making it impossible to perform the correct screening for the cell transistors.

A substrate bias generation circuit contained in the semiconductor memory device may include a substrate potential limiting circuit for reducing current consumption caused by the operation of the substrate bias generation circuit itself. One example of such a substrate potential limiting circuit is shown in FIG. 5. The substrate potential limiting circuit includes a substrate potential detection circuit 62 for detecting the potential of a substrate 60, and a switching circuit 63 for on/off controlling the operation of a substrate bias generation circuit 61 according to the output of the substrate potential detection circuit 62.

With the substrate potential limiting circuit, when the substrate potential is lowered to reach a certain potential level, the substrate potential detection circuit 62 is operated and causes the switching circuit 63 to interrupt the operation of the substrate bias generation circuit 61, so that the substrate bias generation circuit 61 will not consume its power until the substrate potential exceeds again the threshold voltage of the substrate potential detection circuit 62.

As described above, according to the conventional semiconductor memory device, when the power supply level Vcc is raised at the time of the burn-in test, the voltage of the word line drive signal is at substantially the same level as that at the normal operation time, and the high level word line drive signal cannot be applied to the cell transistors, thereby making it impossible to perform the correct screening for the cell transistors.

SUMMARY OF THE INVENTION

Accordingly, an object of this invention is to provide a semiconductor memory device in which, when the power supply level Vcc is raised at the time of the burn-in test, the voltage of the word line drive signal is increased to a value higher than at the normal operation time, and the high level word line drive signal can be applied to the cell transistors, thereby making it possible to perform the correct screening for the cell transistors.

A semiconductor memory device according to the invention comprises a word line drive circuit including a first MOS transistor having two terminals (source and drain terminals) and a gate, a row decode output signal being entered in one terminal of the first MOS transistor, a desired electric potential being applied to the gate of the first MOS transistor, a second MOS transistor having two terminals (source and drain terminals) and a gate, the gate of the second MOS transistor being connected to the other of the first MOS transistor, a word line drive control signal being applied to one terminal of the second MOS transistor, and a word line connected to the other of the second MOS transistor, a word line drive signal fed from the other of the second MOS transistor being supplied to the word line; a substrate bias generation circuit for applying a bias voltage to a semiconductor substrate in which the MOS transistors are provided; a burn-in mode detection circuit for detecting a burn-in test mode signal input supplied from an external device; and a substrate bias control circuit for controlling the substrate bias generation circuit so as to lower the bias voltage according to the detection output of the burn-in mode detection circuit.

In the above semiconductor memory device, when the row decode output signal is enabled to reach the power supply level Vcc, the first transistor is turned on and the potential of the node B on the other terminal thereof (on the gate side of the second transistor) becomes "Vcc − |Vtn|" (Vtn is the gate threshold voltage of the first transistor). The potential of the node B rises until junction breakdown is caused by the coupling of the first transistor. At this time, the potential of the node B is increased to a voltage given by (junction breakdown voltage—substrate bias voltage). Then the potential of the word line drive signal C rises as the potential of the node B is increased.

When the above operation is performed at the time of the burn-in test, the substrate bias voltage is controlled to be lowered by means of the burn-in mode detection circuit and substrate bias control circuit, so that the potential of the node B will be raised to a sufficiently high level. As a result, the voltage of the word line drive signal will be increased to a voltage higher than at the normal operation time and the high level word line drive signal can be applied to the cell transistors, thereby making it possible to perform correct screening for the cell transistors.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1 a diagram showing a part of a structure of a DRAM according to an embodiment of the present invention;

FIG. 2 is a diagram for illustrating an operation of drive circuit shown in FIG. 1;

DETAILED DESCRIPTION OF THE PREFERRED EMBODIMENT

Figure 3:
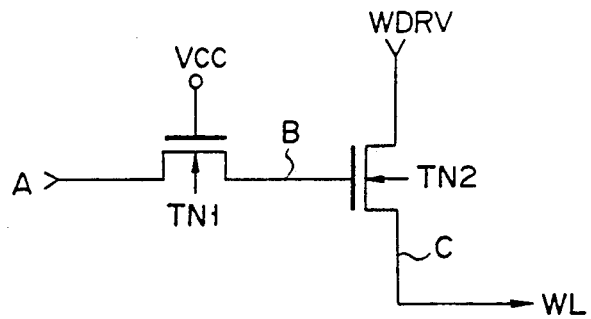
FIG. 3 is a circuit diagram showing a word line drive circuit in a conventional DRAM.
Figure 4:
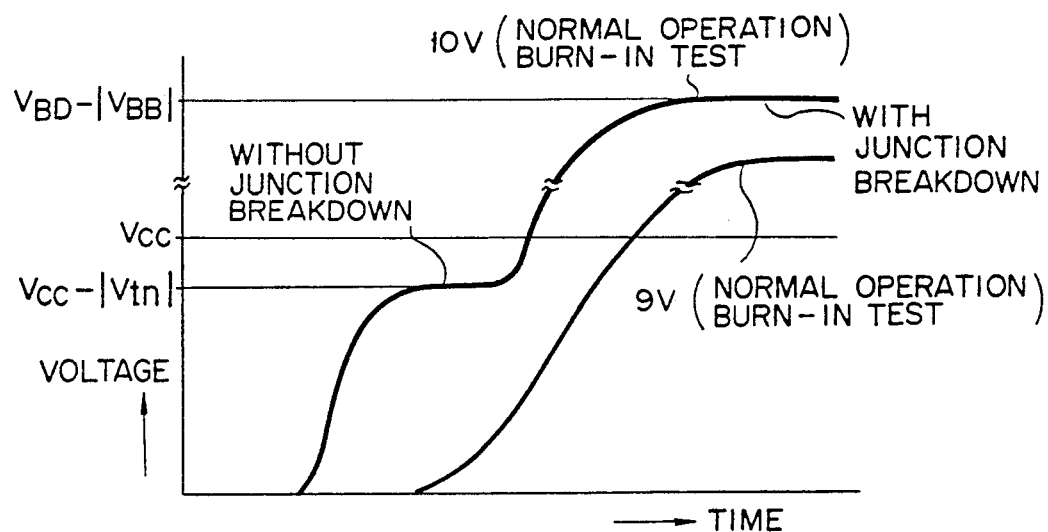
FIG. 4 is a waveform diagram for illustrating an operation of the word line drive circuit shown in FIG. 3.
Figure 5:
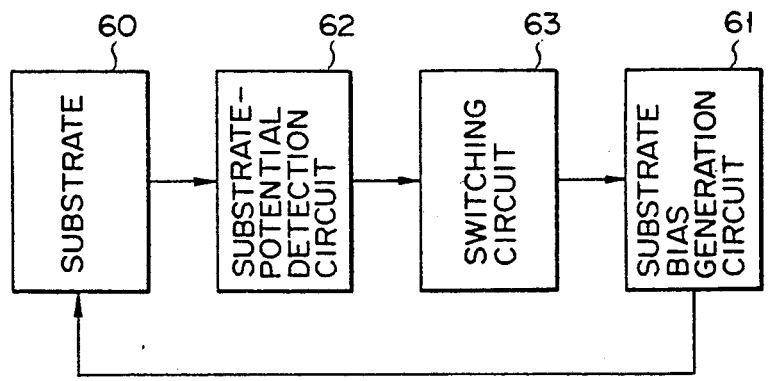
FIG. 5 is a block diagram showing an example of a conventional substrate potential limiting circuit.

An embodiment of the invention will now be described with reference to the accompanying drawings.

FIG. 1 shows a part of a DRAM in which 10 denotes a semiconductor substrate, 11 a substrate bias generation circuit for applying a bias voltage to the substrate 10, 12 a first substrate potential detection circuit for detecting the substrate potential to be set at the time of normal operation, 13 a first switching circuit for on/off controlling the operation of the substrate bias generation circuit 11 according to the detection output of the substrate potential detection circuit 12, 14 a burn-in mode detection circuit for detecting an input of a burn-in test mode signal supplied from an external device, 15 a substrate bias control circuit for controlling the substrate bias generation circuit 11 so as to lower the bias voltage according to the burn-in test mode detection output of the burn-in mode detection circuit 14, and 16 a word line drive circuit provided on the substrate 10, respectively.

The word line drive circuit 16 has a circuit configuration similar to that of the conventional word line drive circuit described with reference to FIG. 3. That is, a row decode output signal A is entered in one end of the first N-channel transistor TN1 from a row decoder (not shown), a power supply potential Vcc (for example, 5V) is applied to the gate thereof, and the other end thereof is connected to the gate of the second N-channel transistor TN2. A word line drive control signal WDRV is applied to one end of the second transistor TN2, and a bootstrapped word line drive signal C, fed from the other thereof, is supplied to a word line WL. The word line is connected to the respective gates of a large number of cell transistors (not shown).

The substrate bias control circuit 15 includes a second substrate potential detection circuit 17 for detecting the substrate potential to be set at the time of a burn-in test, and a second switching circuit 18 which is controlled to an enabled condition by the detection output of the burn-in mode detection circuit 14 and which on/off controls the operation of the substrate bias generation circuit 11 according to the detection output of the second substrate potential detection circuit 17.

For example, the second substrate potential detection circuit 17 is provided as shown in FIG. 1. That is, a first P-channel transistor P1, whose gate is connected to a ground potential (Vss) node, a first N-channel transistor N1, whose gate is connected to a Vcc power supply node, and a second P-channel transistor P2, whose gate and drain are connected to each other, are connected in series between the Vcc power supply node and the substrate 10, while a third P-channel transistor P3, a fourth P-channel transistor P4, whose gate is connected to the Vss node, and a second N-channel transistor N2 are connected in series between the Vcc node and the Vss node. The drain of the first N-channel transistor N1 is connected to the respective gates of the third P-channel transistor P3 and the second N-channel transistor N2. An inverter INV is provided by the third P-channel transistor P3, fourth P-channel transistor P4 and second N-channel transistor N2.

The first P-channel transistor P1 and first N-channel transistor N1 operate to perform a ratio operation for controlling the current flowing therethrough and determining the substrate potential. The size ratio of the second N-channel transistor N2 to the third and fourth P-channel transistors P3 and P4 is made high, and is set immediately to change the potential at an output node D (the drain of the N-channel N2) to a lower level when the gate potential of the third P-channel transistor P3 and second N-channel transistor N2 slightly exceeds the threshold voltage Vtn of the second N-channel transistor N2.

When the second switching circuit 18 is set in the operating condition by the detection output of the burning mode detection circuit 14, it enables or disables the operation of the substrate bias generation circuit 11, respectively, according to a low or high level given by the detection output at the output node D of the second substrate potential detection circuit 17.

Now, the operation of the substrate bias control circuit 15 at the time of the burn-in test will be explained. When the substrate potential is lower than the substrate potential to be set at the time of the burn-in test, the potential at the output node D of the second substrate potential detection circuit 17 is at a high level and the second switching circuit 18 disables the operation of the substrate bias generation circuit 11. When the substrate potential is gradually raised by a junction leak for example, and becomes higher than the substrate potential to be set at the time of the burn-in test, the second substrate potential detection circuit 17 becomes operative and sets the potential at the output node D to a low level, while the second switching circuit 18 enables the operation of the substrate bias generation circuit 11.

Next, the operation of the circuit of FIG. 1, performed when the row decode output signal A becomes an enabled level (power supply level Vcc of 5V, in this example), will be explained with reference to FIG. 2. When the row decode output signal A becomes the power supply level Vcc, the first transistor TNI is turned on and the potential of the node B on other end thereof (on the gate side of the second transistor TN2) becomes "Vcc−|Vtn|" (Vtn is the gate threshold voltage of the first transistor TN1). The potential of the node B rises until junction breakdown is caused by the coupling of the first transistor TN1. The potential of the node B at this time becomes "$V_{BD}-|VBB|$" and the potential of the word line drive signal C rises as the potential of the node B is increased. At this time, $V_{BD}$ is the junction breakdown voltage of N-type high impurity concentration regions for the source and drain of the N-channel transistor, and $V_{BB}$ is the voltage of the substrate 10 (P-type substrate or P-type well), in which the N-channel transistors are provided.

When the above operation is performed at the time of the burn-in test, the substrate bias voltage is controlled so as to be lowered by means of the burn-in mode detection circuit 14 and substrate bias control circuit 15, so that the potential of the node B will be raised to a sufficiently high level and the voltage of the word line drive signal C will be increased as compared with the voltage at the time of normal operation.

For example, if the word line drive control signal WDRV is 7.5V, the junction breakdown voltage $V_{BD}$ is 12V, the substrate voltage $V_{BB}$ at the time of normal operation (the power supply level Vcc is 5V) is −3V, the substrate voltage $V_{BB}$ in the burn-in test (the power supply level Vcc is 7V) is 0V, and the gate threshold voltage Vtn is 1.5V, then at the time of normal operation the potential of the node B becomes approximately 9V and the word line drive signal C becomes, approximately 7.5V. In contrast, at the time of the burn-in test, the potential of the node B will be raised to approximately 12V and the word line drive signal C will be raised to approximately 11.5V.

The burn-in test mode signal input, which is supplied from the external terminal exclusively assigned for the burn-in mode, is detected in the burn-in mode detection circuit 14 described in the embodiment. However, it may be possible to provide various structures as the burn-in mode detection circuits. For example, a signal input, supplied to a desired external signal terminal, is ternary-controlled to obtain a burning test mode signal input, and such a signal input may be employed.

Further, the substrate bias control circuit 15 is not limited to that described above, but may be provided in any configuration to control the substrate bias generation circuit 11 so as to lower the substrate bias voltage according to the burn-in test mode detection output of the burn-in mode detection circuit.

As described above, according to the semiconductor memory device of the invention, since the voltage of the word line drive signal can be increased at the time of the burn-in test to a value higher than at the time of the normal operation when the power supply level Vcc is raised, the high level word line drive signal can be applied to the cell transistors, thereby making it possible to perform the correct screening for the cell transistors.

It is further understood by those skilled in the art that the foregoing description is a preferred embodiment of the disclosed device and that various changes and modifications may be made in the invention without departing from the spirit and scope thereof.

What is claimed is:

1. A semiconductor memory device comprising:
   a semiconductor substrate;
   a word line drive circuit including first and second MOS transistors provided in said semiconductor substrate, each of said MOS transistors having source and drain terminals and a gate terminal, one of said source and drain terminals of said first MOS transistor being connected to said gate terminal of said second MOS transistor, a power source potential being applied to said gate terminal of said first MOS transistor, a word line selection signal being applied to the other of said source and drain terminals of said first MOS transistor, and a word line drive control signal being applied to one of said source and drain terminals of said second MOS transistor to provide a word line drive signal for a word line coupled to the other of said source and drain terminals of said second MOS transistor;
   a substrate bias generation circuit for generating a bias voltage applied to said semiconductor substrate;
   a burn-in test mode detection circuit for detecting a burn-in test mode signal applied from an external device and generating an output signal in response thereto; and
   a substrate bias control circuit for controlling the bias voltage generated by said substrate bias generation circuit in response to the output signal of said burn-in test mode detection circuit.

2. The semiconductor memory device according to claim 1, wherein said substrate bias control circuit controls said substrate bias generation circuit to reduce the bias voltage in response to a first level of the output signal of said burn-in test mode detection circuit relative to a bias voltage generated by said substrate bias generation circuit if the output signal of said burn-in test mode detection circuit is at a second level, the reduction in said bias voltage thereby increasing a voltage of the word line drive signal.

3. The semiconductor memory device according to claim 1, wherein said substrate bias control circuit includes a substrate potential circuit for detecting the bias voltage during a burn-in test, and a switching circuit responsive to said substrate potential detection circuit and to said burn-in mode detection circuit for controlling ON/OFF switching of said substrate bias generation circuit.

4. A semiconductor memory device comprising:
   a semiconductor substrate;
   a word line drive circuit including fist and second MOS transistors provided in said semiconductor substrate, each of said MOS transistors having source and drain terminals and a gate terminal, one of said source and drain terminals of said first MOS transistor being connected to said gate terminal of said second MOS transistor, a power source potential being applied to said gate terminal of said first MOS transistor, a word line selection signal being applied to the other of said source and drain terminals of said first MOS transistor, and a word line drive control signal being applied to one of said source and drain terminals of said second MOS transistor to provide a word line drive signal for a word line coupled to the other of said source and drain terminals of said second MOS transistor;

a substrate bias generation circuit for generating first and second bias voltages applied to said semiconductor substrate, said first bias voltage being set during a normal operation of said semiconductor memory device and said second bias voltage being set during a burn-in test of said semiconductor memory device;

a first substrate potential detection circuit for detecting said first bias voltage;

a first switching circuit responsive to said first substrate potential detection circuit for controlling ON/OFF switching of said substrate bias generation circuit;

a burn-in test mode detection circuit for detecting a burn-in test mode signal applied from an external device;

a second substrate potential detection circuit for detecting said second bias voltage; and a second switching circuit responsive to said second substrate potential detection circuit for controlling ON/OFF switching of said substrate bias generation circuit.

5. The semiconductor memory device according to claim 4, wherein said second substrate potential detection circuit controls said second bias voltage in response to an output of said burn-in test mode detection circuit so as to increase a voltage of said gate terminal of said second MOS transistor, thereby increasing a voltage of the word line drive signal.

6. The semiconductor memory device according to claim 4 wherein said second substrate potential detection circuit comprises:

a third MOS transistor of a first channel conductivity type, a fourth MOS transistor of a second channel conductivity type and a fifth MOS transistor of the first channel conductivity type, said third, fourth, and fifth MOS transistors connected in series between said semiconductor substrate and a power source potential, a gate of said third MOS transistor coupled to a reference voltage source, a gate of said fourth MOS transistor coupled to the power source potential, and a gate of said fifth MOS transistor coupled said semiconductor substrate; and an inverter having an input node coupled to a connection node between said third and fourth MOS transistors and an output node coupled to said second switching circuit.

7. The semiconductor memory device according to claim 6 wherein said inverter comprises:

a sixth MOS transistor of the first channel conductivity type, a seventh MOS transistor of the first channel conductivity type, and an eighth MOS transistor of the second channel conductivity type, said sixth, seventh, and eighth MOS transistors connected in series between the power source potential and the reference potential, a gate of said seventh MOS transistor coupled to the reference source potential and gates of said sixth and eighth MOS transistors coupled to said input node of said inverter, a connection node of said seventh and eighth MOS transistors being said output node of said inverter.

8. A semiconductor memory device comprising:

a word line driving circuit for driving word lines associated with memory cells of said semiconductor memory device; and control means for controlling said word line driving circuit, said control means including first means for controlling said word line driving circuit to drive an addressed word line with a first voltage during a normal operation of said semiconductor memory device and second means for controlling said word line driving circuit to drive said addressed word line with a second voltage having a magnitude greater than the first voltage during a burn-in test operation for detecting an erroneous operation of said memory cells of said semiconductor memory device.

9. The semiconductor memory device according to claim 8 wherein said word line driving circuit comprises:

first and second MOS transistors provided in a semiconductor substrate, each of said MOS transistors having source and drain terminals and a gate terminal, one of said source and drain terminals of said first MOS transistor being connected to said gate terminal of said second MOS transistor, a power source potential being applied to said gate terminal of said first MOS transistor, a word line selection signal being applied to the other of said source and drain terminals of said first MOS transistor, and a word line drive control signal being applied to one of said source and drain terminals of said second MOS transistor to provide a word line drive signal for a word line coupled to the other of said source and drain terminals of said second MOS transistor.

* * * * *